(12) United States Patent
Chan et al.

(10) Patent No.: US 9,982,338 B2
(45) Date of Patent: May 29, 2018

(54) HIGH-THROUGHPUT SYSTEM AND METHOD FOR POST-IMPLANTATION SINGLE WAFER WARM-UP

(71) Applicant: Taiwan Semiconductor Manufacturing Company, Ltd., Hsinchu (TW)

(72) Inventors: Tsun-Jen Chan, Taoyuan County (TW); Cheng-Hung Hu, Hsinchu (TW); Yi-Hann Chen, Hsinchu (TW); Kang Hua Chang, Hsinchu (TW); Ming-Te Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 15/597,377

(22) Filed: May 17, 2017

(65) Prior Publication Data

US 2017/0247790 A1 Aug. 31, 2017

Related U.S. Application Data

(62) Division of application No. 14/205,299, filed on Mar. 11, 2014, now Pat. No. 9,663,854.

(Continued)

(51) Int. Cl.
| | |
|---|---|
| *C23C 14/54* | (2006.01) |
| *H01L 21/677* | (2006.01) |
| *H01L 21/67* | (2006.01) |
| *H01L 21/265* | (2006.01) |
| *H01J 37/317* | (2006.01) |

(52) U.S. Cl.
CPC .......... *C23C 14/54* (2013.01); *H01J 37/3171* (2013.01); *H01L 21/265* (2013.01); *H01L 21/26593* (2013.01); *H01L 21/67115* (2013.01); *H01L 21/67201* (2013.01); *H01L 21/67213* (2013.01); *H01L 21/67745* (2013.01); *H01J 2237/31701* (2013.01)

(58) Field of Classification Search
CPC . C23C 14/54; H01J 37/2655; H01J 37/26593; H01J 37/3171; H01J 37/265; H01L 21/67115; H01L 21/67201; H01L 21/67213; H01L 21/67745; H01L 21/265; H01L 21/26593
See application file for complete search history.

(56) References Cited

U.S. PATENT DOCUMENTS

| | | | | |
|---|---|---|---|---|
| 7,059,817 B2 * | 6/2006 | Sieradzki | .......... | H01L 21/67745 414/217 |
| 7,935,942 B2 * | 5/2011 | England | ............ | H01L 21/26593 118/723 CB |

(Continued)

FOREIGN PATENT DOCUMENTS

TW 200809930 2/2008

*Primary Examiner* — David E Smith
(74) *Attorney, Agent, or Firm* — Haynes and Boone, LLP

(57) ABSTRACT

A system includes an implantation chamber; a warming chamber, wherein the warming chamber is outside of the implantation chamber and has a sidewall shared with the implantation chamber; a first robotic arm configured to move a first wafer from the implantation chamber into the warming chamber; and a second robotic arm configured to move a second wafer into the implantation chamber.

20 Claims, 4 Drawing Sheets

Related U.S. Application Data

(60) Provisional application No. 61/785,729, filed on Mar. 14, 2013.

(56) References Cited

U.S. PATENT DOCUMENTS

| | | |
|---|---|---|
| 8,450,193 B2 | 5/2013 | England et al. |
| 2002/0068422 A1 | 6/2002 | Dairiki |
| 2006/0182532 A1 | 8/2006 | Okada |
| 2008/0044257 A1* | 2/2008 | England ................. H01J 37/20 414/217.1 |
| 2010/0181500 A1 | 7/2010 | Chang |
| 2010/0301236 A1 | 12/2010 | Shieh |
| 2011/0143461 A1* | 6/2011 | Fish ................. H01L 21/67115 438/5 |
| 2014/0034846 A1* | 2/2014 | Lee ......................... H01J 37/18 250/453.11 |
| 2015/0380285 A1* | 12/2015 | Huseinovic ........... H01L 21/265 438/530 |

\* cited by examiner

HIGH-THROUGHPUT SYSTEM AND METHOD FOR POST-IMPLANTATION SINGLE WAFER WARM-UP

PRIORITY DATA

This is a divisional application of U.S. patent application Ser. No. 14/205,299, filed Mar. 11, 2014, which claims priority to U.S. Provisional Patent Application No. 61/785,729, filed Mar. 14, 2013, the entire disclosure of which is hereby incorporated herein by reference.

BACKGROUND

In conventional semiconductor fabrication processes, there are number of techniques for warming the wafers back to room temperature after low temperature implantation is complete. In one such technique, the wafer is warmed directly by the platen. In another, room temperature air is injected into the load lock and used to warm the wafers slowly. Lastly, a single tube-type lamp may be positioned inside the load lock to warm the wafers.

However, all these conventional techniques have disadvantages. Heating the platen directly results in low wafer per hour ("WPH") and reduces the throughput as it takes more time of the processing chamber. Injecting room temperature air into the load lock also results in low WPH and wafer spotting defects due to water condensation resulting from mist, in addition to absorbing a lot of time and negatively affecting throughput. Those techniques utilizing a single lamp to warm the wafers results in non-uniform heating, which further causes non-uniform dopant diffusion and non-uniform device behavior from wafer to wafer and from die to die.

Accordingly, there is a need in the art for a wafer warming technique which alleviates or eliminates these disadvantages.

BRIEF DESCRIPTION OF THE DRAWINGS

The present disclosure is best understood from the following detailed description when read in conjunction with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Illustrative embodiments and related methodologies of the present invention are described below as they might be employed in a high throughput system and method for warming a semiconductor wafer after low temperature implantation has occurred. In the interest of clarity, not all features of an actual implementation or methodology are described in this specification. It will of course be appreciated that in the development of any such actual embodiment, numerous implementation specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the invention will become apparent from consideration of the following description and drawings.

As described herein, the present invention is directed to a time-efficient, high throughput system and method for warming a wafer to a desired temperature after undergoing a low temperature implantation process. In general, an exemplary system includes an implantation chamber, a wafer warming chamber configured to uniformly warm a single wafer, and a plurality of robotic arms to transfer wafers throughout the system. During an exemplary methodology, a first wafer undergoes a low temperature ion-implementation process and is transferred to the warming chamber by one of the robotic arms. While the first wafer is being transferred to the warming chamber, a second wafer is transferred to the implementation chamber using a second robotic arm. As the first wafer is being warmed to substantially room temperature in the warming chamber, the second wafer undergoes implantation. The first wafer may then be transferred out of the warming chamber while the second wafer is transferred into the warming chamber. This process may occur for any number of wafers. Thus, at each stage in the fabrication process, the system (via the robotic arms) can simultaneously work with multiple wafers and, therefore, provide a high throughput process. In addition, the warming chamber may be a vacuum environment, thus eliminating the mist-condensation problem that results in wafer spotting. Accordingly, the wafer uniformity is increased, while also alleviating those issues related to wafer spotting and non-uniform heating associated with prior art methodologies.

Figure 1:
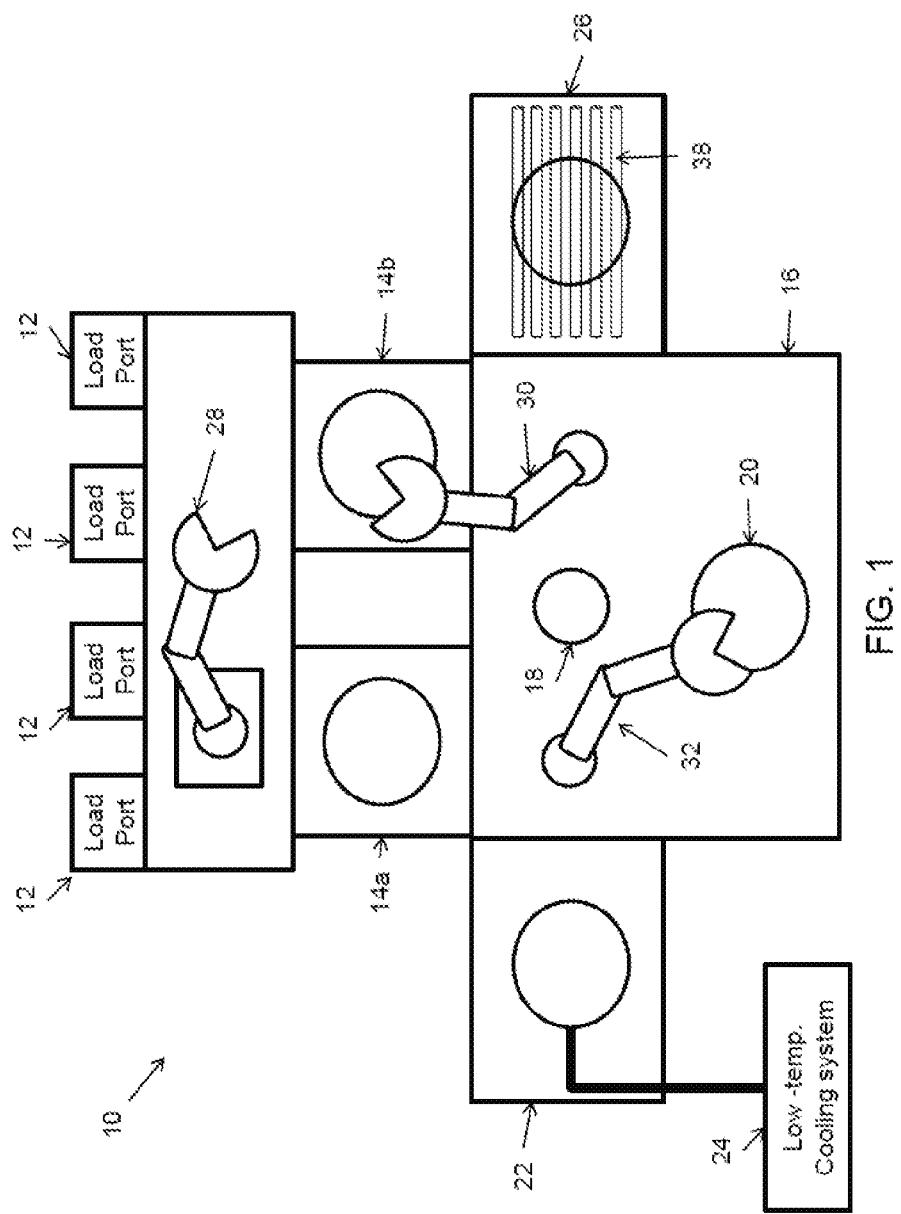
FIG. 1 is a top-side view of a semiconductor wafer fabrication system according to certain exemplary embodiments of the present invention.

FIG. 1 is a top-side view of a semiconductor wafer fabrication system 10 according to certain exemplary embodiments of the present invention. Wafer fabrication system 10 comprises a plurality of load ports 12 positioned adjacent a first and second load lock 14a,14b. As understood in the art, load locks 14a,14b are configured to hold a plurality of wafers during fabrication. Load locks 14a,14b are positioned adjacent an implantation chamber 16, which includes a wafer orientor 18 and platen 20. Implantation chamber 16 may be configured to perform a variety of implantation techniques, such as, for example, low temperature ion-implantation or room temperature implantation.

In this example, a pre-implantation cooling chamber 22 is positioned adjacent implantation chamber 16 to cool the wafers prior to implantation. In one exemplary embodiment, pre-implantation cooling chamber 22 may cool the wafers to −100 C, for example, in order to form the amorphous layer for ultra-shallow junctions, RC and leakage reduction, etc., as will be understood by those ordinarily skilled in the art having the benefit of this disclosure. A low temperature cooling system 24 is communicably coupled to pre-implantation cooling chamber 22 for controlling and providing the cooling environment present within pre-implantation cooling chamber 22. Although not shown, low temperature cooling system 24 includes at least one processor and associated circuitry to achieve its functionality.

Still referring to the exemplary embodiment of FIG. 1, wafer fabrication system 10 further includes a single wafer warming chamber 26 positioned adjacent to implantation chamber 16. In an alternative embodiment, however, single wafer warming chamber 26 may also be positioned inside implantation chamber 16 as an implantation stage chamber. As described herein, single wafer warming chamber 26 comprises one or more heating elements configured to uniformly heat the wafers. In addition, a robotic arm 28 is positioned adjacent load ports 12 for transferring wafers between load ports 12 and load locks 14a,14b. Robotic arms 30,32 are positioned inside implantation chamber 16 for simultaneously transferring wafers between load locks 14a, 14b, implantation chamber 16, pre-implantation cooling chamber 22, and single wafer warming chamber 26. Although three robotic arms are illustrated, those ordinarily skilled in the art having the benefit of this disclosure realize more or less arms may also be utilized as desired.

Although not illustrated, exemplary embodiments of wafer fabrication system 10 may include at least one processor, non-transitory computer-readable storage, communication module, I/O devices, an optional display, etc., all interconnected via a system bus. Software instructions executable by the processor for implementing the methodologies described herein may be stored in the system storage or some other computer-readable medium, or uploaded into such memories from another storage media via wired/wireless methodologies. In addition, wafer fabrication system 10 may be connected to one or more public and/or private networks via appropriate network connections.

Moreover, those ordinarily skilled in the art will appreciate that the invention may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof in a computer system or other processing system.

Figure 2:
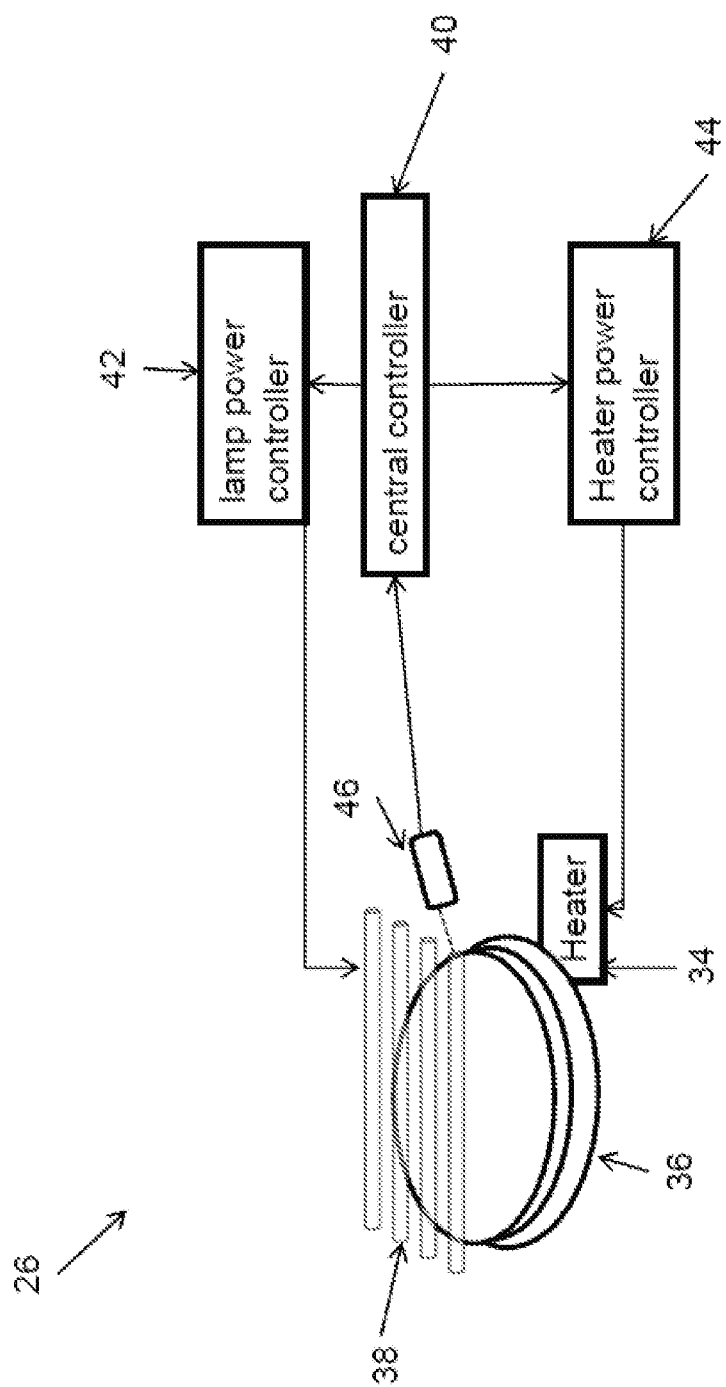
FIG. 2 illustrates a block diagrammatical view of single wafer warming chamber, according to certain exemplary embodiments of the present invention.

FIG. 2 illustrates a block diagrammatical view of single wafer warming chamber 26, according to certain exemplary embodiments of the present invention. For simplicity of understanding, not each feature of the chamber is illustrated here. However, those ordinarily skilled in the art having the benefit of this disclosure will readily understand how the described warming chamber may be fabricated and altered as desired. In one example, a thermal mechanism similar to a rapid thermal annealing ("RTA") tool may be used in the system. However, in the present embodiment, the warming chamber 26 is incorporated in the semiconductor wafer fabrication system 10. Nevertheless, in one exemplary embodiment, single wafer warming chamber 26 comprises a base 36 on which the wafers are positioned. Base 36 comprises a first heating element 34 configured to warm the lower surface of the wafers to a desired temperature. In the present example, such desired temperature is room temperature or substantially room temperature.

A second heating element 38 is positioned above base 36 in order to warm the upper surface of the wafers. Thus, first and second heating elements 34,38 work in combination to uniformly heat the wafers to the desired temperature. The heating duration depends on the heating power and the initial temperature of the wafer. In one example, the heating duration may take a few seconds to a few minutes. The heating elements may be a variety of elements, such as, for example, lamp-type heaters or conventional heating elements. In one example, halogen lamps may be used as heating elements. Moreover, in certain embodiments, single wafer warming chamber may be a vacuum chamber. In such embodiments, utilizing lamp type heaters will provide for greater heating efficiency that will also eliminate mist-condensation issues.

Certain exemplary embodiments of single wafer warming chamber 26 may also comprise a temperature control loop. Thus, as illustrated in FIG. 2, an exemplary control loop comprises a close-loop central controller 40 that is communicably coupled to a lamp power controller 42 and a heater power controller 44. A sensor 46 (pyro sensor, for example) is communicably coupled to central controller 40 and serves as the input to detect and transmit the temperature of the wafer to central controller 40. Thereafter, central controller 40 transmits the necessary control signals to lamp power controller 42 and heater power controller 44 to alter or maintain the temperature of the wafer as desired.

Figure 3:
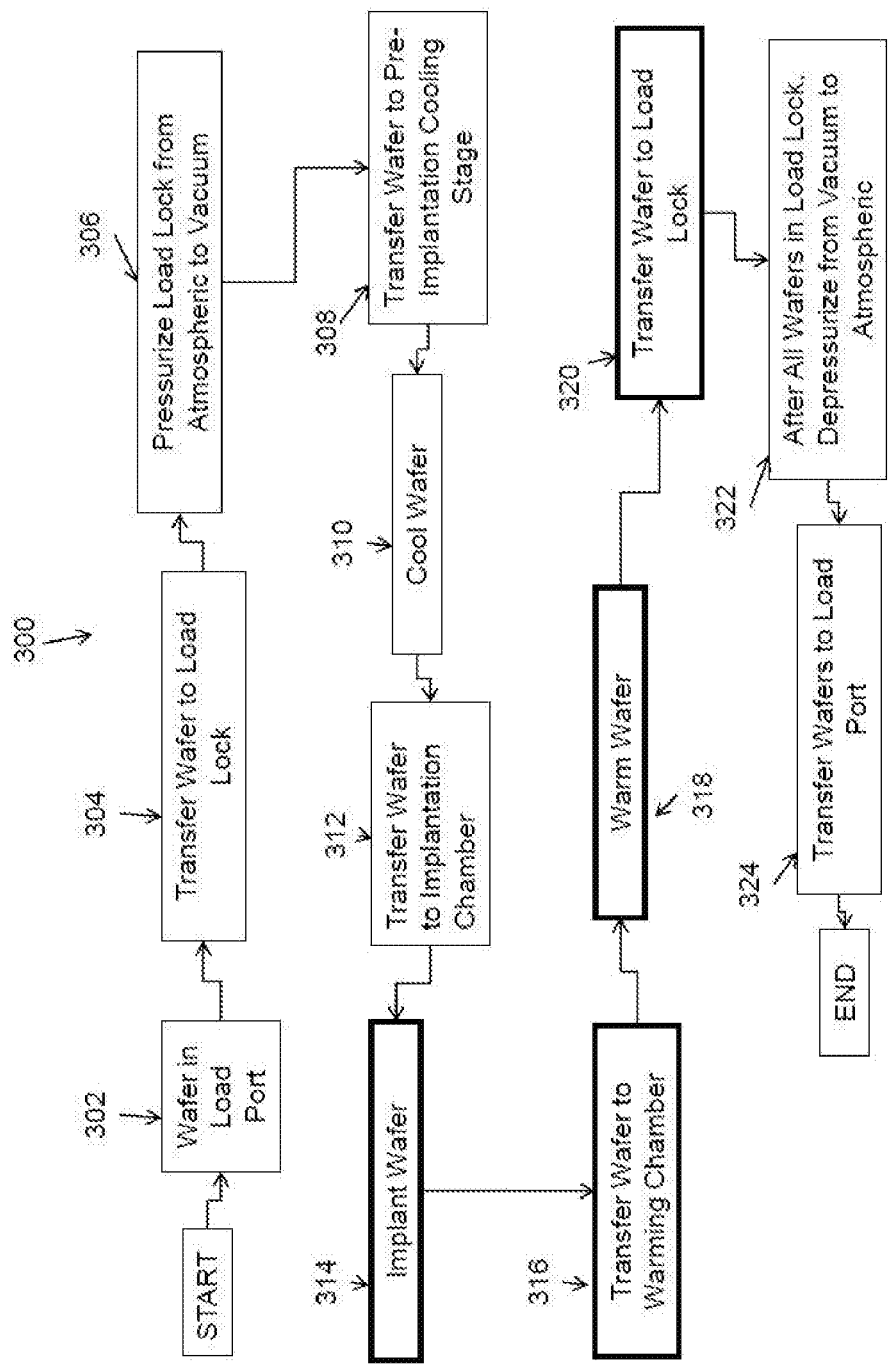
FIG. 3 is a flow chart of a high-throughput semiconductor fabrication process utilizing a post-implantation warming stage, according to certain exemplary methodologies of the present invention.

Now, with reference to FIGS. 1 and 3, an exemplary methodology 300 of the present invention will now be described. As described herein, method 300 is a high-throughput semiconductor fabrication process utilizing a post-implantation warming stage. At block 302, a plurality of wafers are loaded into load ports 12, and transferred to load lock 14a by robotic arm 28 at block 304. After the desired number of wafers is loaded into load lock 14a, wafer fabrication system 10 increases the pressure inside load lock 14a from atmospheric to vacuum. At block 308, wafer fabrication system 10 then transfers a single first wafer from load lock 14a to pre-implantation cooling chamber 22 using robotic arm 32. At block 310, wafer fabrication system 10 then cools down the first wafer using cooling system 24. At block 312, robotic arm 32 then transfers the cooled first wafer to platen 20 of implantation chamber 16, where the first wafer undergoes an implantation process (low temp ion-implantation, for example) at block 314.

At block 316, wafer fabrication system 10 then transfers the first wafer to single wafer warming chamber 26 using robotic arm 30, where the first wafer is warmed to substantially room temperature, for example, at block 318. Although not illustrated, in one exemplary methodology, robotic arm 32 may transfer a second wafer from cooling chamber 22 to implantation chamber 16 while robotic arm 30 is transferring the first wafer to single wafer warming chamber (block 318). As will be discussed in more detail below, such simultaneous transference of wafers through wafer fabrication system 10 provides a high-throughput fabrication process. Nevertheless, at block 320, the first wafer is then transferred to load lock 14b. The foregoing process continues on any desired number of wafers until all are transferred to load lock 14b, and wafer fabrication system 10 then returns the pressure from vacuum to atmospheric at block 322 using robotic arm 30. Thereafter, wafer fabrication system 10 then transfers the wafers back to load ports 12 using robotic arm 28.

Figure 4:
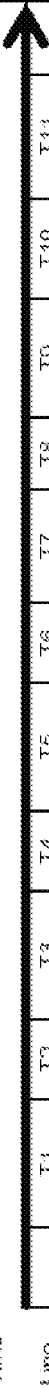
FIG. 4 illustrates a high throughput time sequence according to certain exemplary methodologies of the present invention.

FIG. 4 illustrates a time lapse methodology 400 useful to further describe certain exemplary methodologies of the present invention. In this example, only four wafers will be described, although any number of wafers may be fabricated using method 400. Note that not every step in this exemplary method will be described here; rather, method 400 is intended to more clearly illustrate the time efficiency, and resulting high-throughput, provided by the present invention. The exemplary time slots (T1,T2,TN . . . ) described herein may be any desired length as dictated by system design or otherwise (for example, 30~500 seconds), as will be understood by those ordinarily skilled in the art having the benefit of this disclosure.

With reference to FIG. 4, at time T1, a first wafer (wafer 01) is transferred to implantation chamber 16. At time T2, the first wafer undergoes a low-temperature implantation process within implantation chamber 16. At time T3, the first wafer is then transferred to single wafer warming chamber 26 while a second wafer (wafer 02) is transferred to implantation chamber 16. At time T4, the first wafer is then warmed to the desired temperature inside single wafer warming chamber 26, while the second wafer undergoes low temperature implantation inside implantation chamber 16. At time T5, the first wafer is then transferred back to load lock 14a,14b, while the second wafer is transferred to single wafer warming chamber 26, and a third wafer (wafer 03) is transferred to implantation chamber 16. At time T6, the first wafer is now ready for further processing, while the second wafer is being warmed to the desired temperature inside single wafer warming chamber 26, and the third wafer undergoes low temperature implantation inside implantation chamber 16.

At time T7, the second wafer is then transferred to load lock 14a,14b where it is ready for further processing, while the third wafer is transferred to single wafer warming chamber 26, and a forth wafer (wafer 04) is transferred to implantation chamber 16. At time T8, the third wafer is then warmed up to the desired temperature inside single wafer warming chamber 26, while the fourth wafer undergoes low temperature implantation inside implantation chamber 16. At time T9, the third wafer is then transferred back to load lock 14a,14b, while the fourth wafer is then transferred to single wafer warming chamber 26. At time T10, the fourth wafer is then warmed to the desired temperature and then transferred back to load lock 14a,b at time T11. Accordingly, the wafers have been warmed from a low temperature to a desired temperature in a rapid, high-throughput fashion.

An exemplary methodology of the present invention provides a method for fabricating a semiconductor wafer comprising transferring a first semiconductor wafer to an implantation chamber and performing an implantation process on the first semiconductor wafer within the implantation chamber. After the implantation process on the first semiconductor wafer is complete, the first semiconductor wafer is transferred to the warming chamber while a second semiconductor wafer is simultaneously transferred to the implantation chamber. The first semiconductor wafer is then warmed within the warming chamber while the implementation process is simultaneously performed on the second semiconductor wafer. The first semiconductor wafer is then transferred out of the warming chamber for further processing while the second semiconductor wafer is simultaneously transferred to the warming chamber where it is warmed.

An exemplary embodiment of the present invention provides a system for fabricating a semiconductor wafer comprising an implantation chamber, a first and second robotic arm operably connected to the implantation chamber in order to transfer semiconductor wafers through the system, a pre-implantation cool down chamber positioned adjacent the implantation chamber, a load lock positioned adjacent the implantation chamber, and a warming chamber comprising one or more heating elements configured to warm the semiconductor wafers. In addition, the system comprises processing circuitry to implement any of the methods described herein.

In addition, an exemplary methodology of the present invention provides a method for fabricating a semiconductor wafer comprising implanting a first wafer inside an implantation chamber at time T1 and transferring the first wafer to a warming chamber at time T2. A second wafer is also transferred to the implementation chamber at time T2. At time T3, the first wafer is warmed inside the warming chamber and the second wafer is implanted inside the implantation chamber. At time T4, the first wafer is transferred out of the warming chamber for further processing and the second wafer is transferred to the warming chamber. At time T5, the second wafer is warmed inside the warming chamber.

The foregoing outlines features of several embodiments so that those ordinarily skilled in the art may better understand the aspects of the present disclosure. Those skilled persons should appreciate that they may readily use the present disclosure as a basis for designing or modifying other processes and structures for carrying out the same purposes and/or achieving the same advantages of the embodiments and methodologies introduced herein. For example, although a single wafer warming chamber is described herein, those ordinarily skilled persons would realize that a multiple wafer warming chamber may also be utilized. As such, those same skilled persons should also realize that such equivalent constructions do not depart from the spirit and scope of the present disclosure, and that they may make various changes, substitutions, and alterations herein without departing from the spirit and scope of the present disclosure. Therefore, it should be understood that the invention is not intended to be limited to the particular forms disclosed. Rather, the intention is to cover all modifications, equivalents, and alternatives falling within the spirit and scope of the invention as defined by the appended claims.

What is claimed is:

1. A system, comprising:
   an implantation chamber having a first side and a second side;
   a cooling chamber disposed outside of the implantation chamber along the first side of the implantation chamber;
   a warming chamber disposed outside of the implantation chamber along the second side of the implantation chamber;
   a first robotic arm configured to move a first wafer from the implantation chamber into the warming chamber; and
   a second robotic arm configured to move a second wafer into the implantation chamber.

2. The system of claim 1, wherein the first and second robotic arms are located inside the implantation chamber.

3. The system of claim 1, wherein the first robotic arm is configured to reach into the warming chamber.

4. The system of claim 1,
   wherein the second robotic arm is configured to move the second wafer from the cooling chamber into the implantation chamber.

5. The system of claim 4, wherein the second robotic arm is configured to reach into the cooling chamber.

6. The system of claim 1, wherein:
the implantation chamber is configured to perform an implantation process on the second wafer; and
the warming chamber is configured to perform a warming process on the first wafer simultaneously when the implantation process on the second wafer is performed.

7. The system of claim 6, wherein the warming process comprises warming the first wafer to a temperature substantially equal to room temperature.

8. The system of claim 1, wherein the implantation chamber further has a third side connecting the first side and the second side, the system further comprising: a load lock outside of the implantation chamber along the third side of the implantation chamber, wherein the first robotic arm is configured to move the first wafer from the warming chamber to the load lock.

9. The system of claim 8, wherein the first robotic arm is configure to move the first wafer from the warming chamber to the load lock through the implantation chamber.

10. The system of claim 1, wherein the warming chamber is a single wafer warming chamber.

11. A system for fabricating a semiconductor wafer, the system comprising:
an implantation chamber having a first side and a second side;
a cooling chamber outside of the implantation chamber along the first side of the implantation chamber;
a warming chamber adjacent to and outside of the implantation chamber along the second side of the implantation chamber;
a first arm located in the implantation chamber and configured to reach into the warming chamber for a first transferring operation that moves a first wafer from the implantation chamber to the warming chamber; and
a second arm configured for a second transferring operation that moves a second wafer from the cooling chamber to the implantation chamber.

12. The system of claim 11, wherein the cooling chamber is connected to the implantation chamber.

13. The system of claim 11, wherein the implantation chamber further has a third side connecting the first side and the second side, the system further comprising:
a first load lock outside of the implantation chamber along the third side of the implantation chamber, wherein the first arm is configured to move the first wafer from the warming chamber to the first load lock; and
a second load lock outside of the implantation chamber along the third side of the implantation chamber, wherein the second arm is configured to move the second wafer from the second load lock to the cooling chamber.

14. The system of claim 13, wherein moving of the first wafer from the warming chamber to the first load lock is performed simultaneously with moving of the second wafer from the second load lock to the cooling chamber.

15. The system of claim 11, wherein the warming chamber is a vacuum chamber.

16. A system for fabricating a semiconductor wafer, the system comprising:
an implantation chamber configured to execute an implantation process, the implantation chamber having a first side, a second side, and a third side connecting the first side and the second side;
a cooling chamber outside of the implantation chamber along the first side of the implantation chamber;
a warming chamber disposed outside of and along the second side of the implantation chamber and configured to execute an warming process;
a first transferring device configured to transfer a first semiconductor wafer from the implantation chamber to the warming chamber;
a second transferring device configured to transfer a second semiconductor wafer from the cooling chamber to the implantation chamber; and
a load lock outside of the warming chamber along the third side of the implantation chamber, wherein the first transferring device is also configured to transfer the first semiconductor wafer from the warming chamber to the load lock.

17. The system of claim 16, wherein the first transferring device is configured to transfer the first semiconductor wafer from the warming chamber to the load lock through the implantation chamber.

18. The system of claim 16, wherein the first transferring device is configured to reach into the warming chamber.

19. The system of claim 16, wherein the second transferring device is configured to reach into the cooling chamber.

20. The system of claim 16, wherein the first and second transferring devices are physically connected to the implantation chamber.

* * * * *